(12) United States Patent  
Sun

(10) Patent No.: US 8,939,425 B2  
(45) Date of Patent: Jan. 27, 2015

(54) MOUNTING DEVICE FOR FAN

(75) Inventor: Zheng-Heng Sun, New Taipei (TW)

(73) Assignee: ScienBiziP Consulting (Shenzhen) Co., Ltd., Guangdong (CN)

( * ) Notice: Subject to any disclaimer, the term of this patent is extended or adjusted under 35 U.S.C. 154(b) by 364 days.

(21) Appl. No.: 13/448,425

(22) Filed: Apr. 17, 2012

(65) Prior Publication Data

US 2013/0256500 A1    Oct. 3, 2013

(30) Foreign Application Priority Data

Mar. 28, 2012  (CN) .......................... 2012 1 0085942

(51) Int. Cl.
*F16M 1/00*   (2006.01)
*F01D 25/24*  (2006.01)

(52) U.S. Cl.
USPC .......... 248/672; 248/673; 248/674; 248/675; 248/499; 248/500; 248/680; 248/510; 361/694; 361/695; 361/679.48; 361/679.47; 361/679.01; 415/60; 415/214.1; 415/213.1; 415/220; 415/189; 415/190; 417/423.14; 417/423.9; 416/244 R; 411/182; 411/15; 411/110; 411/502

(58) Field of Classification Search
CPC .......... G06F 1/20; G06F 1/203; G06F 1/206; H01L 23/46; H01L 23/467; H05K 7/20172; F04D 29/60; F04D 29/601; B41J 29/04
USPC ......... 248/672–675, 678, 499, 500, 680, 510; 361/694, 695, 679.48, 679.47, 679.01; 415/60, 214.1, 213.1, 220, 189, 190; 417/423.14, 423.9; 416/244 R; 16/78; 411/182, 15, 110, 502

See application file for complete search history.

(56) References Cited

U.S. PATENT DOCUMENTS

| | | | | |
|---|---|---|---|---|
| 5,788,566 | A  * | 8/1998 | McAnally et al. | 454/184 |
| 5,969,941 | A  * | 10/1999 | Cho | 361/679.48 |
| 7,545,641 | B2 * | 6/2009 | Chen | 361/695 |
| 7,940,525 | B2 * | 5/2011 | Letourneau | 361/695 |
| 2004/0162018 | A1* | 8/2004 | Lee et al. | 454/184 |
| 2008/0259562 | A1* | 10/2008 | Chen | 361/690 |
| 2009/0021911 | A1* | 1/2009 | Lee et al. | 361/695 |
| 2011/0211948 | A1* | 9/2011 | Hsu | 415/213.1 |
| 2012/0114461 | A1* | 5/2012 | Chen | 415/119 |

* cited by examiner

*Primary Examiner* — Christopher Garft
(74) *Attorney, Agent, or Firm* — Novak Druce Connolly Bove + Quigg LLP

(57) ABSTRACT

A mounting device for mounting a fan includes a base board and two fixing assemblies. The fan includes two opposite boards. The base board forms four rods. Each fixing assembly includes a receiving member and an engaging member. The receiving member includes a first pole capable of extending through a corresponding one of the boards and a first block abutting against an outer surface of the board. The engaging member includes a second pole capable of extending though the other one of the boards to be engaged in the first pole, and a second block abutting against an outer surface of the other board. Each of the first and second blocks defines a fixing hole through which a corresponding one of the rods is capable of extending.

2 Claims, 3 Drawing Sheets

MOUNTING DEVICE FOR FAN

CROSS-REFERENCE TO RELATED APPLICATIONS

Relevant subject matter is disclosed in the pending U.S. patent applications, all titled "MOUNTING DEVICE FOR FAN", respectively filed on Apr. 2, 2012, with the application Ser. No. 13/437,025 and filed on Apr. 12, 2012, with the application Ser. No. 13/444,875, and on Apr. 13, 2012, with the application Ser. No. 13/445,940, and, which are assigned to the same assignee as this patent application.

BACKGROUND

1. Technical Field

The present disclosure relates to a device for mounting fans.

2. Description of Related Art

Many electronic devices use fans to cool internal components. The fans may be mounted to a rack by a plurality of screws, and then is mounted in an electronic device together with the rack, which adds to the cost of the rack.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
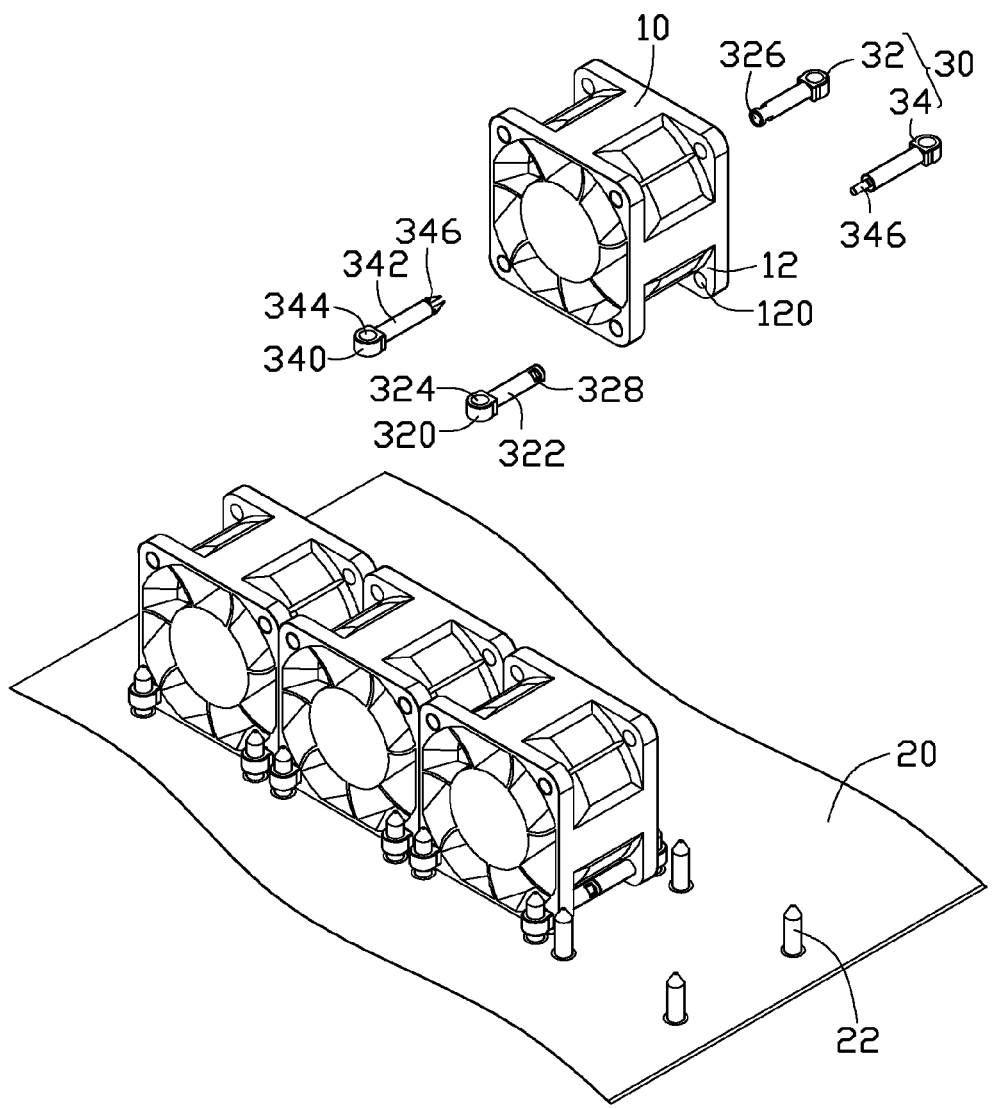
FIG. 1 is an exploded, isometric view of an exemplary embodiment of a mounting device, together with a plurality of fans.

FIG. 1 shows an exemplary embodiment of a mounting device for fixing a plurality of fans 10. The mounting device includes a base board 20 and a plurality of fixing assemblies 30.

Each fan 10 includes two spaced boards 12. Each board 12 defines two corner holes 120 in a lower portion of the board 12.

The base board 20 forms a plurality of rods 22. Each rod 22 has a tapered distal end.

Each fixing assembly 30 includes a receiving member 32 and an engaging member 34.

The receiving member 32 includes a first block 320 defining a fixing hole 324 extending through a top and a bottom of the first block 320, and a first pole 322 extending out from a side of the first block 320. The first pole 322 axially defines a receiving hole 326 in an end opposite to the first block 320, and a through hole 328 in the circumference of the end. The through hole 328 extends through opposite outer surfaces of the circumference of the first pole 322 and communicates with the receiving hole 326.

The engaging member 34 includes a second block 340 defining a fixing hole 344 extending through a top and a bottom of the first block 340, and a second pole 342 extending out from a side of the second block 340. Two spaced latches 346 extend out from an end of the second pole 342 opposite to the first block 340, along a direction substantially parallel to the axis of the second pole 342. Each latch 346 has a tapered distal end.

Figure 2:
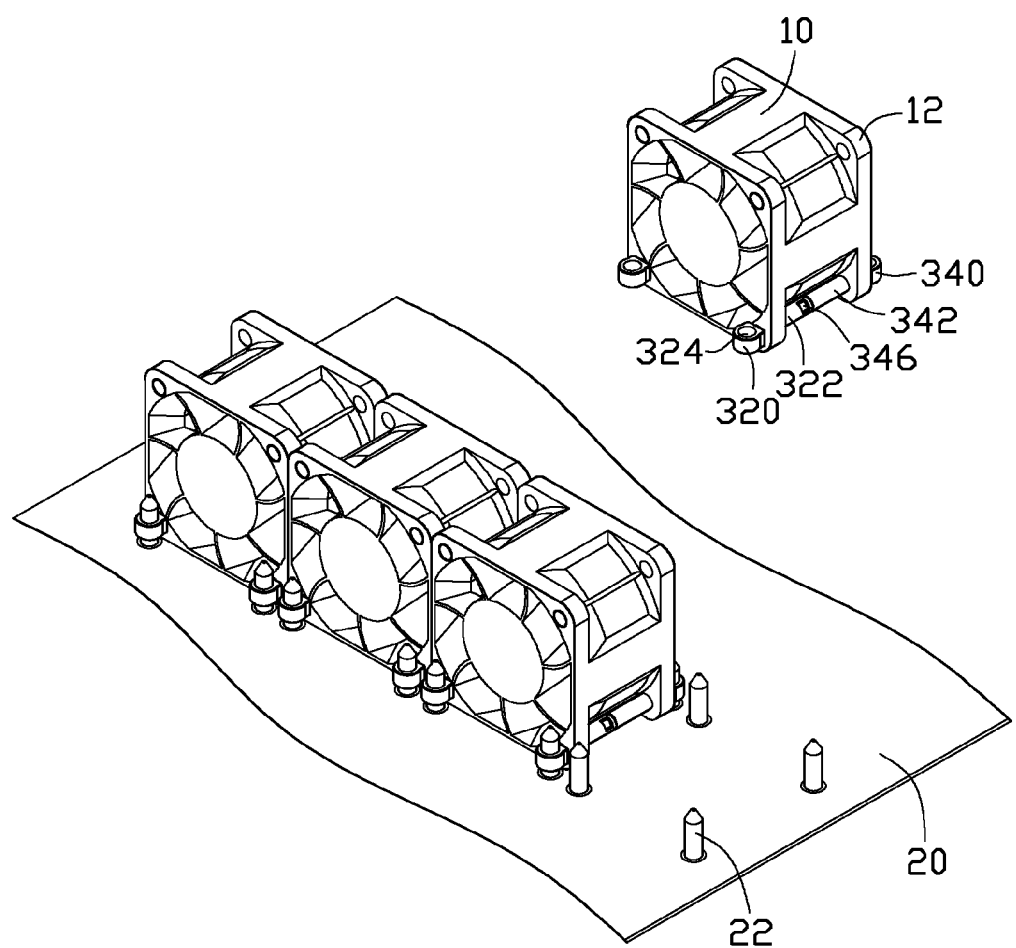
FIG. 2 is a partly assembled view of the mounting device and the fans of FIG. 1.
Figure 3:
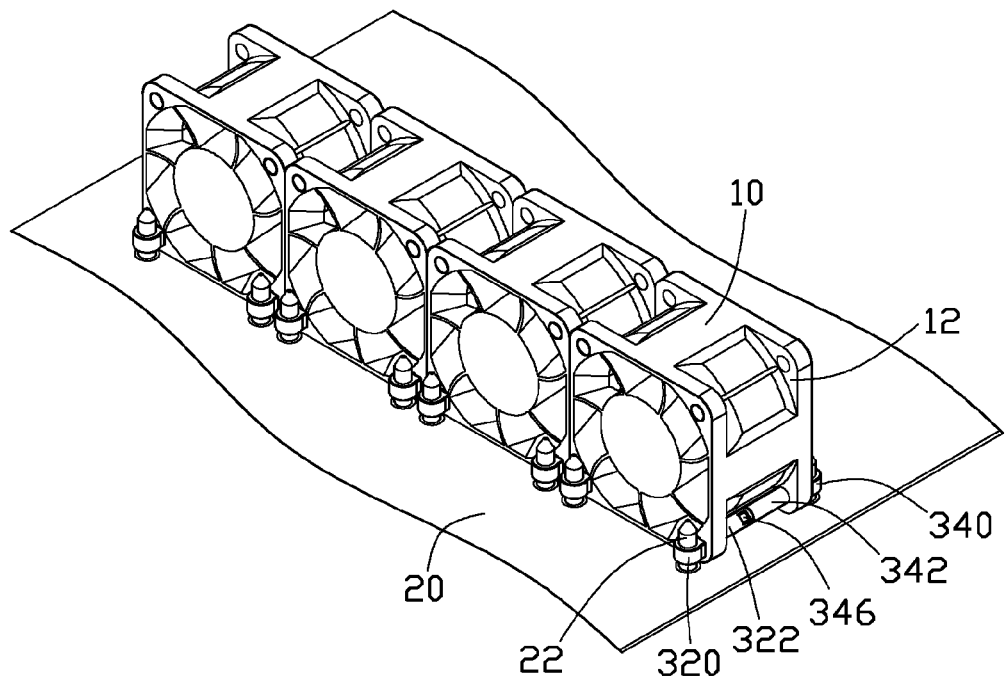
FIG. 3 is an assembled, isometric view of the mounting device and the fans of FIG. 2.

Referring to FIGS. 2 and 3, in mounting each fan 10 to the base board 20, the first poles 322 extend through the corresponding corner holes 120 of the corresponding boards 12, until the first blocks 320 abut against outer surfaces of the corresponding boards 12. The second poles 342 extend through the corner holes 120 of the boards 12, until the latches 346 of each engaging member 34 are deformed toward each other to extend into the receiving hole 326 of a corresponding one of the receiving members 32. After the latches 326 aligning with the corresponding through hole 328, the latches 346 are restored to extend through the through hole 328 and engage with the opposite outer surfaces of the circumference of the first pole 322. The second blocks 340 abut against outer surfaces of the corresponding boards 12.

The fixing holes 32 firmly fit about four corresponding rods 22, thereby fixing the fan 10 to the base board 20.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A mounting device for mounting a fan having two opposite boards, comprising:

a base board forming four rods; and two fixing assemblies each comprising a receiving member and an engaging member, the receiving member comprising a first pole to extend through a first board and a first block formed at an end of the first pole to be abutted against an outer surface of the first board, the engaging member comprising a second pole to be extended though a second board and then engaged with the first pole, and a second block formed at an end of the second pole to be abutted against an outer surface of the second board, each of the first and second blocks defining a fixing hole through which a corresponding one of the rods is to extend.

2. The mounting device of claim 1, wherein a receiving hole is axially defined in an end of the first pole opposite to the first block, a through hole is defined in a circumference of the first pole, the through hole extends through opposite sides of the circumference and communicates with the receiving hole, two spaced latches extend out from an end of the second pole opposite the second block to be deformable toward each other to enter the receiving hole and extend through the through hole of the corresponding first pole, therefore, the latches engage with the opposite sides of the circumference of the first pole.

* * * * *